(12) United States Patent
Shahvandi et al.

(10) Patent No.: US 6,290,491 B1
(45) Date of Patent: Sep. 18, 2001

(54) METHOD FOR HEATING A SEMICONDUCTOR WAFER IN A PROCESS CHAMBER BY A SHOWER HEAD, AND PROCESS CHAMBER

(75) Inventors: Iraj Shahvandi; Oliver Vatel; Peggy John, all of Dresden (DE)

(73) Assignees: Motorola, Inc., SchaUmburg, IL (US); Semiconductor 300 GmbH & Co. KG, Dresden; Infineon Technologies AG, Munich, both of (DE)

( * ) Notice: Subject to any disclaimer, the term of this patent is extended or adjusted under 35 U.S.C. 154(b) by 0 days.

(21) Appl. No.: 09/607,155

(22) Filed: Jun. 29, 2000

(51) Int. Cl.[7] .................................................. F27D 5/00
(52) U.S. Cl. ............................... 432/5; 118/724; 118/725
(58) Field of Search .................................. 432/5, 6, 253, 432/258, 259; 118/627, 642, 722, 724, 725, 728

(56) References Cited

U.S. PATENT DOCUMENTS

| | | | |
|---|---|---|---|
| 4,680,061 | 7/1987 | Lamont, Jr. ............................ | 148/1.5 |
| 4,870,923 | * 10/1989 | Sugimoto .............................. | 118/725 |
| 4,949,783 | 8/1990 | Lakios et al. ......................... | 165/80.1 |
| 5,133,284 | 7/1992 | Thomas et al. ....................... | 118/719 |
| 5,213,650 | * 5/1993 | Wang et al. .......................... | 118/728 |
| 5,248,370 | 9/1993 | Tsui et al. ............................. | 156/345 |
| 5,501,739 | * 3/1996 | Yamada et al. ...................... | 118/725 |
| 5,624,498 | * 4/1997 | Lee et al. ............................. | 118/725 |
| 5,781,693 | * 7/1998 | Ballance et al. ..................... | 118/724 |
| 5,936,829 | 8/1999 | Moslehi ................................ | 361/234 |
| 6,143,081 | * 11/2000 | Shinriki et al. ....................... | 118/725 |

* cited by examiner

*Primary Examiner*—Gregory Wilson

(57) ABSTRACT

Heating (200) a semiconductor wafer (150) in a process chamber (100) is performed in the order of: placing (210) the wafer (100) with the backside (152) on a plurality of support elements (112) that extend from a chuck (100); ejecting (220) a heating gas (122, He) from a shower head (120) located within the process chamber (100) to the frontside (151) of the wafer (150); and moving (230) the support elements (112) into recesses (111) within the chuck (100) to that the wafer backside (152) touches the chuck (110).

7 Claims, 1 Drawing Sheet

100

100

METHOD FOR HEATING A SEMICONDUCTOR WAFER IN A PROCESS CHAMBER BY A SHOWER HEAD, AND PROCESS CHAMBER

FIELD OF THE INVENTION

The present invention generally relates to apparatus and method for manufacturing semiconductor circuits, and more particularly, to apparatus and method for processing semiconductor wafers.

BACKGROUND OF THE INVENTION

For manufacturing semiconductor circuits, various transporting and processing steps are consecutively applied to semiconductor wafers (diameter e.g., 300 mm). While the wafer is usually transported in a clean room at room temperature (e.g., 20 . . . 30° C.), the wafer is often processed at a substantially higher process temperature (e.g., 300 . . . 500° C., depending on the process), for example, to deposit a film by well-known techniques (e.g., chemical vapor deposition CVD). For processing, the wafer is placed on a chuck that is usually at process temperature.

However, changing the environment temperature of the wafer rapidly from room temperature to process temperature causes immediate wafer expansion, widely referred to as thermal shock. Due to intrinsic impurities and contamination in the silicon, the heat propagates in the wafer unequally causing further unwanted effects like wafer bowing, misplacement on the chuck, or breakage. In other words, placing the cold wafer on the hot chuck surface should be avoided.

Load-lock systems that couple the clean room and the processing chamber can stepwise increase the environment temperature of the wafer. However, using the load-lock system for preheating is sometimes not desired so that the following scheme is used instead:

In a first step, the wafer is transported into the processing chamber and placed near the chuck; in a second step (heating up, soaking up), the environment temperature near the wafer is increased by a heater block so that the wafer is preheated to the process temperature (e.g., during 90 seconds); and in a third step, the wafer is placed on the chuck and processed.

This scheme reduces mechanical stress and thermal shock of the wafer; however, the chamber is evacuated so that in the heating up step, the heater block can transfer heat substantially only by radiation. Also, the chamber is temporarily prevented from processing, thus reducing the throughput. In other words, the expensive chamber is booked for the low value adding heating up step for an undesired long time.

The present invention seeks to provide apparatus and method which mitigate or avoid these and other disadvantages and limitations of the prior art.

DETAILED DESCRIPTION OF A PREFERRED EMBODIMENT

The present invention replaces the time-consuming heating up step by short-time hot helium showering of the wafer frontside. The heat is substantially transferred by forced convection. Thereby, mechanical stress, thermal shock, and bowing of the wafer are also avoided.

Figure 1:
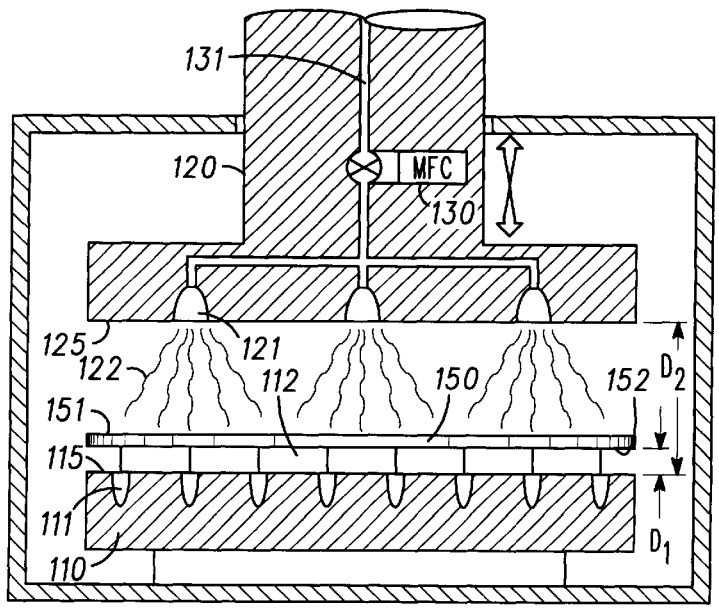
FIGS. 1–2 illustrate a method of the present invention by simplified side view diagrams of a processing chamber of the present invention in a first mode and in a second mode.
Figure 2:
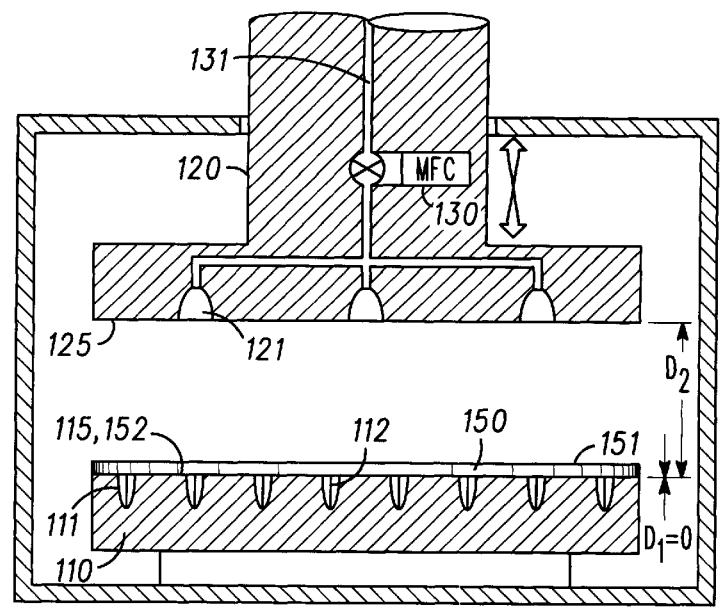

FIGS. 1–2 illustrate a method of the present invention by simplified side view diagrams of processing chamber 100 of the present invention in a first mode (FIG. 1) and in a second mode (FIG. 2).

In connection with FIG. 3, details for method 200 having steps placing 210, ejecting 220 and moving 230 are also explained in connection with FIG. 3. Steps 210 and 220 are performed when chamber 100 is in the first mode, and step 230 is performed when chamber 100 goes into the second mode.

Semiconductor wafer 150 has frontside 151 and backside 152. Chamber 100 comprises wafer chuck 110 having upper surface 115 and a plurality of support elements 112. Preferably, elements 112 are needles. Elements 112 are either extended vertically to surface 115 (Z direction) or retracted into recesses 111 within chuck 110. Elements like rings that prevent wafer 150 from moving into X or Y directions are well known and therefore not shown.

Further, chamber 100 comprises shower head 120 having a plurality of nozzles 121 ("shower holes") to temporarily eject heating gas 122, that is, preferably, helium. As illustrated, nozzles 121 can receive gas 122, for example, through mass flow controller (MFC) 130. MFC 130 receives the gas from supply line 131 (at a pressure of about 25 . . . 50 psi) and provides a total gas flow to nozzles 121 of about 8 . . . 10 sccm (standard cubic meter per second). Optionally, MFCs can also act separately on each nozzle. Shower head 120 is continuously heated up to process temperature, for example, by plasma or process gases in chamber 100 so that, preferably, gas 122 heats up on the way from supply line 131 to nozzles 121.

In a first mode (cf. FIG. 1), elements 112 extend from surface 115 and hold wafer 150 at backside 152 so that chuck 110 holds wafer 150 at a predetermined distance $D_1$ to surface 115. Preferably, distance $D_1$ (between wafer backside 152 and surface 115) is substantially equal for all X and Y coordinates. Nozzles 121 eject heating gas 122 to frontside 151 of wafer 150 to heat up wafer 150 to the predetermined process temperature.

In a second mode (cf. FIG. 2), elements 112 are retracted into recesses 111 of chuck 110 so that wafer 150 is placed directly on surface 115 (i.e. $D_1$=0). Nozzles 121 substantially do not eject the gas. Wafer 150 has reached its process temperature and processing can start.

Conveniently, in the first mode, distance $D_2$ between surface 125 of head 120 and surface 115 of chuck 110 is shorter than in the second mode. This can be accomplished by displacing chuck 110 or head 120 into the Z direction.

Preferably, the pressure in chamber 100 is kept to low vacuum (about 2 torr) in both modes.

Figure 3:
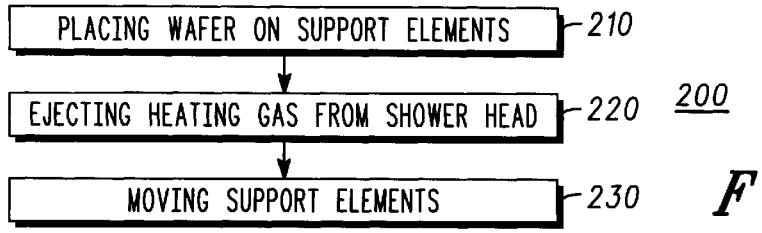
FIG. 3 illustrates a simplified method flow chart diagram of the method.

FIG. 3 illustrates a simplified method flow chart diagram of method 200 for heating semiconductor wafer 150 in process chamber 100. The steps are performed as follows: In placing step 210, wafer 150 is placed with backside 152 on the plurality of support elements 112 that extend from chuck 100 (cf. FIG. 1). This can be accomplished, for example, by a robot well known in the art.

In ejecting step 220, heating gas 122 is ejected from shower head 120 (located within chamber 100, through nozzles 121) to frontside 151. The temperature of wafer 150 is now increasing until the predetermined process temperature. Step 220 is continued, for example, over a predetermined time interval. Or, step 220 is continued until wafer 150 has reached a predetermined threshold temperature that is near the process temperature. Monitoring the wafer temperature is well known in the art and can be accomplished without the need of further explanation herein.

In moving step 230, support elements 112 go into recesses 111 within chuck 100 to that wafer backside 152 touches chuck 100 at surface 115 (distance $D_1=0$)

Compared to the above mentioned method according to the prior art, heating up the wafer to process temperature is accomplished by convection and requires less time (e.g., 7–10 seconds).

Persons of skill in the art can add further steps, such as, for example, for pumping out the heating gas (after step 210) so that the heating gas does not interfere with the process gas used for CVD.

While the invention has been described in terms of particular structures, devices and methods, those of skill in the art will understand based on the description herein that it is not limited merely to such examples and that the full scope of the invention is properly determined by the claims that follow.

What is claimed is:

1. Method for heating a semiconductor wafer in a process chamber, said wafer having a frontside and a backside, said method comprising the following steps:

placing the wafer with the backside on a plurality of support elements that extend from a chuck;

ejecting a heating gas from a shower head located within said process chamber to said frontside;

moving said support elements into recesses within the chuck so that said wafer backside touches said chuck; and processing the wafer with a process gas.

2. The method of claim 1, wherein said ejecting step is continued over a predetermined time interval.

3. The method of claim 1, wherein said ejecting step is continued until said wafer has reached a predetermined threshold temperature.

4. Chamber for processing a semiconductor wafer having a frontside and a backside, said chamber comprising:

a wafer chuck having a surface and a plurality of support elements that in a first mode temporarily extend from said surface to hold said wafer at said backside at a predetermined distance to said surface and that in a second mode are retracted into said chuck to place said wafer with said backside directly on said surface;

a shower head having a plurality of nozzles to eject a gas to said frontside of said wafer;

means for providing a heating gas to said shower head when said chamber is in said first mode to heat up said wafer, and for providing a process gas to said shower head when said chamber is in said second mode.

5. The chamber of claim 4 wherein said support elements are needles.

6. The chamber of claim 4 wherein in said first mode, the distance between said wafer backside and said surface is substantially equal.

7. The chamber of claim 4 wherein said heating gas is helium.

* * * * *